US010405467B2

(12) United States Patent
McGinty et al.

(10) Patent No.: US 10,405,467 B2
(45) Date of Patent: Sep. 3, 2019

(54) INTEGRATED THERMAL DOOR COMPONENT FOR HEAD MOUNTED DISPLAY

(71) Applicant: GOOGLE LLC, Mountain View, CA (US)

(72) Inventors: Gerald McGinty, Mountain View, CA (US); Ihab Ali, Mountain View, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 15/720,128

(22) Filed: Sep. 29, 2017

(65) Prior Publication Data

US 2019/0104650 A1    Apr. 4, 2019

(51) Int. Cl.
*G06F 1/16* (2006.01)
*G06F 1/20* (2006.01)
(Continued)

(52) U.S. Cl.
CPC ......... *H05K 7/20963* (2013.01); *G06F 1/163* (2013.01); *G06F 1/1637* (2013.01);
(Continued)

(58) Field of Classification Search
CPC . G06F 1/163; G06F 1/203; G06F 1/20; G06F 1/1637; G06F 1/1601;
(Continued)

(56) References Cited

U.S. PATENT DOCUMENTS 6,304,459 B1    10/2001   Toyosato et al.
6,923,537 B2 *  8/2005    Hartley ................... A61F 9/022
                                                             351/83
(Continued)

FOREIGN PATENT DOCUMENTS

CN      206489328 U     9/2017
TW      201624053 A     7/2016

OTHER PUBLICATIONS

International Search Report and Written Opinion dated Oct. 26, 2018 for corresponding International Application No. PCT/US2018/041971, 18 pages.
(Continued)

*Primary Examiner* — Dimary S Lopez Cruz
*Assistant Examiner* — Ingrid D Wright

(57) ABSTRACT

A head mounted display (HMD) device for supporting virtual reality and augmented reality includes a frame and a thermal door component between which a mobile device may be sandwiched. The thermal door component includes a first portion that is substantially planar for reversibly coupling with a portion of a back surface of the mobile device and a heat sink. The heat sink includes a substantially planar portion coupled to a surface of the first portion of the thermal door component. The heat sink may be made of magnesium or other thermally conductive material. A second portion is coupled to the back of the first portion. An opening, channel, or recess that allows access to the interior of the thermal door component by ambient air to allow the thermal door component to draw heat away from the mobile device and the HMD device.

19 Claims, 6 Drawing Sheets

(51) Int. Cl.
*H05K 7/20* (2006.01)
*H04B 5/00* (2006.01)

(52) U.S. Cl.
CPC ............ *G06F 1/1656* (2013.01); *G06F 1/203* (2013.01); *H04B 5/0056* (2013.01)

(58) Field of Classification Search
CPC . G06F 1/1632; G06F 1/1656; H05K 7/20963; H04B 5/0056
See application file for complete search history.

(56) References Cited

U.S. PATENT DOCUMENTS

| | | | |
|---|---|---|---|
| 8,736,938 B1* | 5/2014 | Schlam | E06B 3/00 |
| | | | 359/230 |
| 2010/0079356 A1* | 4/2010 | Hoellwarth | G02B 27/017 |
| | | | 345/8 |
| 2013/0067529 A1* | 3/2013 | Chang | H04N 5/64 |
| | | | 725/152 |
| 2016/0212879 A1 | 7/2016 | Nikkhoo et al. | |
| 2016/0255748 A1 | 9/2016 | Kim et al. | |
| 2017/0090514 A1 | 3/2017 | Byun et al. | |
| 2017/0159881 A1* | 6/2017 | Thomas | F16M 13/04 |
| 2017/0184863 A1 | 6/2017 | Balachandreswaran et al. | |

OTHER PUBLICATIONS

English Translation of Taiwanese Office Action dated Apr. 19, 2019 for corresponding TW Application No. 107121675, 4 pages.

\* cited by examiner

INTEGRATED THERMAL DOOR COMPONENT FOR HEAD MOUNTED DISPLAY

BACKGROUND

Field of the Disclosure

The present disclosure relates generally to head mounted display devices, and more particularly to thermal energy management in such devices.

Description of the Related Art

Head mounted display (HMD) devices typically incorporate a mobile device or display panels and other electronic computing components to create and display various types of content, including virtual reality (VR) content, augmented reality (AR) content, and the like. During operation, HMD devices and mobile devices generate thermal energy. This energy may manifest as a hot surface or may generate hot air currents that may be uncomfortable for a user wearing the HMD device. Further, this thermal energy may degrade operational performance of the devices, especially those devices that require computationally intense activity to render video for display via the HMD device.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
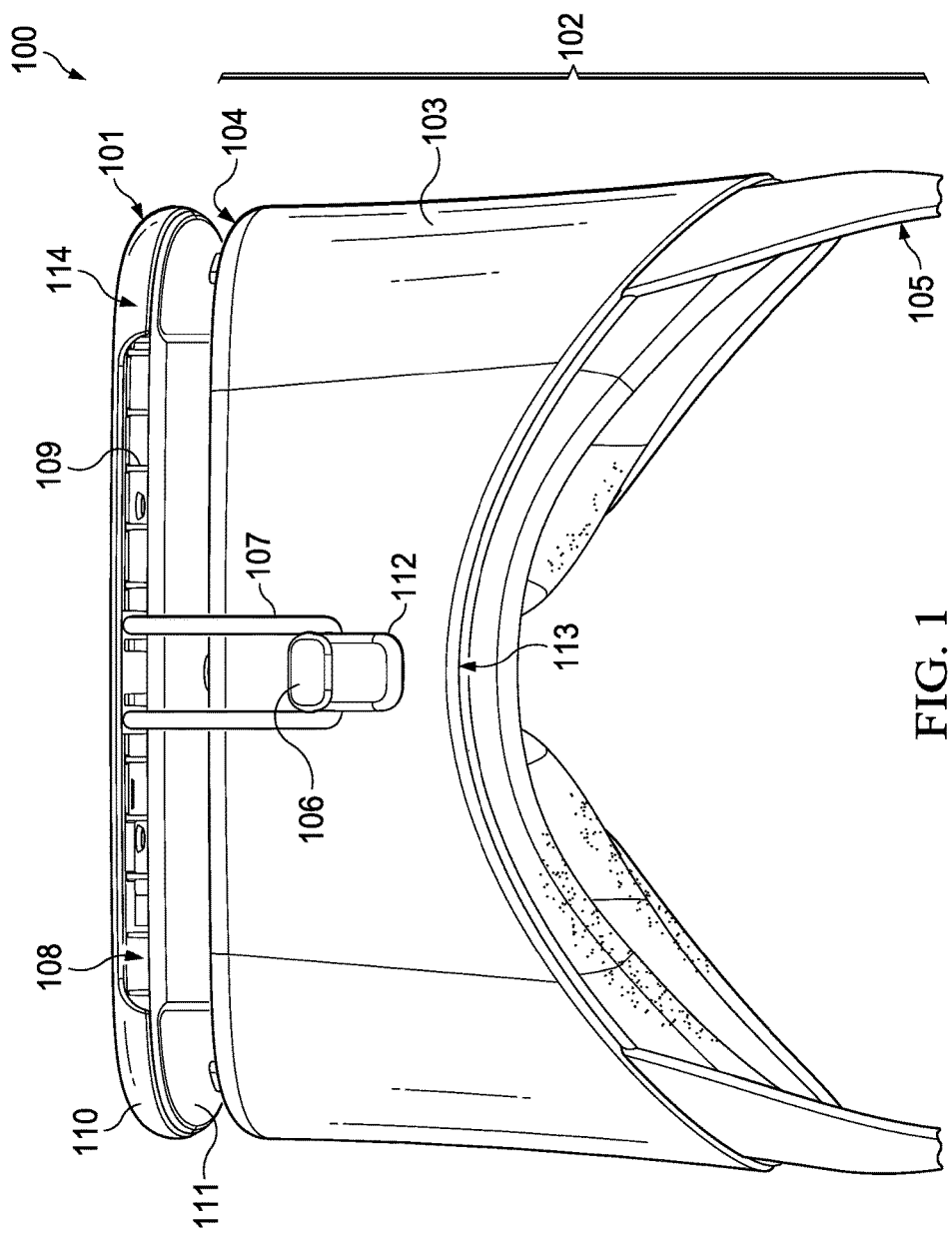
FIG. 1 is a diagram illustrating a top view of a head mounted display (HMD) device having a thermal door component in accordance with some embodiments.

Head mounted display (HMD) devices may incorporate a mobile device or other removable electronic computing components to create and display various types of content. During operation, HMD devices and the mobile devices incorporated therein can generate undesirable thermal energy. Excess thermal energy may degrade operational performance of the devices due to one or more computer elements (e.g., CPU, GPU, RAM, surface temperature sensor) signaling the device to protect itself even at a typical room temperature. For example, the device may be forced to throttle itself downward by reducing a speed of operation or taking another corrective action such as reducing a resolution of video rendering and reducing a frequency of updating a video display. Degrading operational performance is especially common in devices that require computationally intensive activity related to rendering video. Degraded performance leads to a sub-optimal user experience.

While various mechanisms to deal with excessive thermal energy in electronic devices exist, several factors need to be addressed to provide an optimum and pleasing user experience for users wearing HMD devices. For example, noisy moving parts are not desired for HMD devices for augmented reality (AR) or virtual reality (VR) experiences that include audio. Moving parts can wear out and increase costs of manufacture, assembly, and recycling. Moving parts also can pose a hazard for users. Expensive materials cannot be used in a mass-produced product. A slim, lightweight, and passive thermal energy dissipation system is needed to assist in managing thermal energy in HMD devices.

As further described herein, a thermal door component enables an AR or VR viewer or HMD device to support higher power without overheating and to operate at high power levels while remaining cool and more comfortable than previously possible. According to some embodiments, the thermal door component is comprised of a synthetic graphite flexible base coupled or mated on one end to a heat source and on the other end to a heat sink. According to illustrated examples, the heat source is the back of a display such as a mobile device (e.g., mobile phone, tablet). The heat source may include an electromagnetic interference (EMI) shield or shell. The heat may be transferred through an outer case of the mobile device. The thermal door component incorporates a hollow middle portion that acts as a passive heat pump to facilitate removal of thermal energy from the source (hot side) to the sink (cold side) using materials that have a very high lateral thermal conductivity such as a synthetic graphite that has a thermal conductivity great than approximately 1,000 Watts per meter Kelvin (W/m·K). Embodiments of the shape of the thermal door component are optimized for design for manufacturability (DFM) and design for assembly (DFA). The thermal door component has a wide range of dimensional tolerances as it is designed to have a flexible middle portion. The design is used to cool the display assembly and the CPU/DDR parts of a mobile device. Embodiments of the thermal door component ensure SOC and display components, including LEDs, TFT parts, and DDIC parts, stay within thermal operating specifications. Embodiments of the thermal door component enable a CPU junction temperature to be sufficiently low to save on leakage power.

FIG. 1 is a diagram illustrating a top view of an HMD device 100 including a thermal door component 101 in accordance with some embodiments. In FIG. 1, the thermal door component 101 is coupled to a front surface 104 of a head mount body 102 by hinges and an elastic fastener 107. The elastic fastener 107 includes a tag 112 to facilitate gripping the elastic fastener 107 and looping the elastic fastener 107 over a post or a peg 106 on an outer surface 103 of the head mount body 102. In another example, a strap may take the place of the elastic fastener 107 and a hook and loop type fastener (one surface of the fastener on the strap, another surface of the fastener on the outer surface 103) takes the place of the securing mechanism of looping the fastener 107 over the peg 106.

The outer surface 103 is made of a first material that is the same or similar to that of the second portion 110 of the thermal door component 101. The head mount body 102 is held onto a user head by a strap 105 partially illustrated in FIG. 1. A leading edge 113 is placed against a face of the user in front of the user's eyes. According to the embodiment illustrated, the thermal door component 101 is formed with an opening 108 along a top edge 114. The opening 108 allows access into the inner recess of the thermal door component by ambient air. Fins 109 of a thermally conductive material or heat sink are visible inside the opening 108 of the thermal door component 101 between a first portion 111 and a second portion 110 portion thereof.

The first portion 111 may be made of a first material, and the second portion 110 may be made of a second material the same as or different from the first material. For example, the first material may be one or more of a polyamide, a polybutylene terephthalate (PBT), a polycarbonate, a polyphenylene Sulfide (PPS), and a polyetherimide. The first portion 111 and the second portion 110 may be made by way of a two-shot process. For example, a first portion 111 or the second portion 110 may be made of a thermoplastic injected in a mold in a first shot, and may be made of a silicone based material injected into the mold and bonded together with the thermoplastic in a second shot. The two-shot silicone-thermoplastic molding provides a soft silicone cover over or in combination with a relatively hard or stiff thermoplastic. A two-shot component such as the first portion 111 provides a strongly conductive and compressible arrangement so as to effectively transfer heat from a mobile device to the first portion 111, out of an open channel formed in the thermal door component 101, and into the ambient air.

Figure 2:
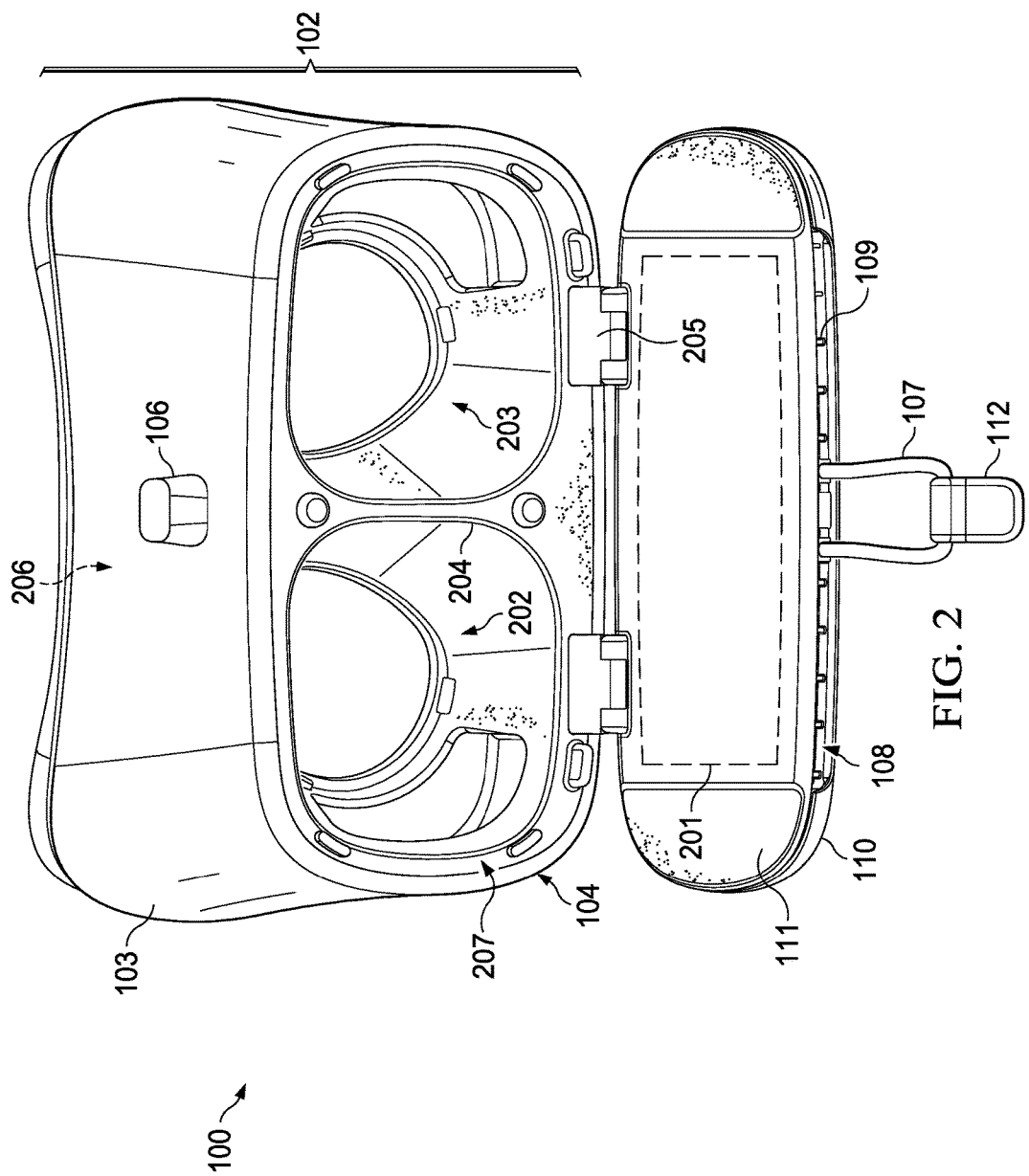
FIG. 2 is a diagram illustrating a front view of the HMD device of FIG. 1 with the thermal door component in an open configuration in accordance with some embodiments.

FIG. 2 is a diagram illustrating a front view of the HMD device 100 of FIG. 1 with the thermal door component 101 in an open configuration in accordance with some embodiments. The head mount body 102 has a capsule-shaped outer profile and outer surface 103. The outer surface 103 is made of a first material that is the same or similar to that of a material included in the second portion 110 of the thermal door component 101. The peg 106 is visible on the top of the head mount body 102. The head mount body 102 forms a viewing compartment 206 and is divided into a first or right chamber 202 and a second or left chamber 203. A recessed region 201 is indicated in FIG. 2 in the first portion 111 where a mobile device (not shown) having a video display screen is to be placed against a distal end 207 of the viewing compartment 206 in the HMD device 100—the display screen facing upward. When the thermal door component 101 is closed, a user is able to view a respective portion of the video display screen through each of the chambers 202, 203.

The thermal door component 101 is coupled to the head mount body 102 by a pair of hinges 205 and the elastic fastener 107. The tag 112 of the elastic fastener 107 is placed over the peg 106 to keep the thermal door component 101 in a closed position and to maintain a force or pressure against a mobile device within the HMD device 100. A hinge 205 is centered below each of the chambers 202, 203. The shape or outer silhouette of the first portion 111 and the shape or outer silhouette of the second portion 110 are similar or the same as the shape of the capsule-shaped outer surface 103. The shape of the thermal door component 101, including the shape of the second portion 110, is selected so as to be substantially free of sharp corners to avoid the chance for a corner or edge to unnecessarily or unintentionally catch on a surface, clothing, or other object when the HMD device 100 is in use.

When closed, the first portion 111 of the thermal door component 101 is reversibly mated or coupled to the front surface 104 of the head mount body 102. A back of a mobile device is placed against the first portion 111 and a front of the mobile device is placed against an inner support structure 204 of the head mount body 102. When the HMD device 100 is closed, the back of the mobile device is contiguous with the first portion 111. Conductive heat transfer occurs between the back of the mobile device and the first portion 111. Heat passes into the opening or recess 108 between the first portion 111 and the second portion 110. In use, the opening 108 is vertical. Ambient air inside the opening 108 is heated and escapes upward from the opening along the edge of the thermal door component 101. According to various embodiments, fins 109 made of a thermally conductive material divide the opening 108 into two or more regions. The opening 108 may be open at a top edge and open at a bottom edge thereby forming one or more channels through an interior of the body of the thermal door component 101. By lowering the temperature within the opening 108, the temperature of the first portion 111 of the thermal door component 101 is lowered. The thermal door component 101 thereby becomes a heat sink for the electronic mobile device within the HMD device 100 thereby allowing the mobile device, including the electronic display screen, to exhaust heat out of the back of the thermal door component 101 instead of allowing heat to build up inside of the chambers 202, 203. Lower amounts of heat inside of the chambers 202, 203 provide a better experience for the user wearing the HMD device 100 and allows a mobile device to operate at full capacity thereby providing a more responsive and improved visual experience to the user.

Figure 3:
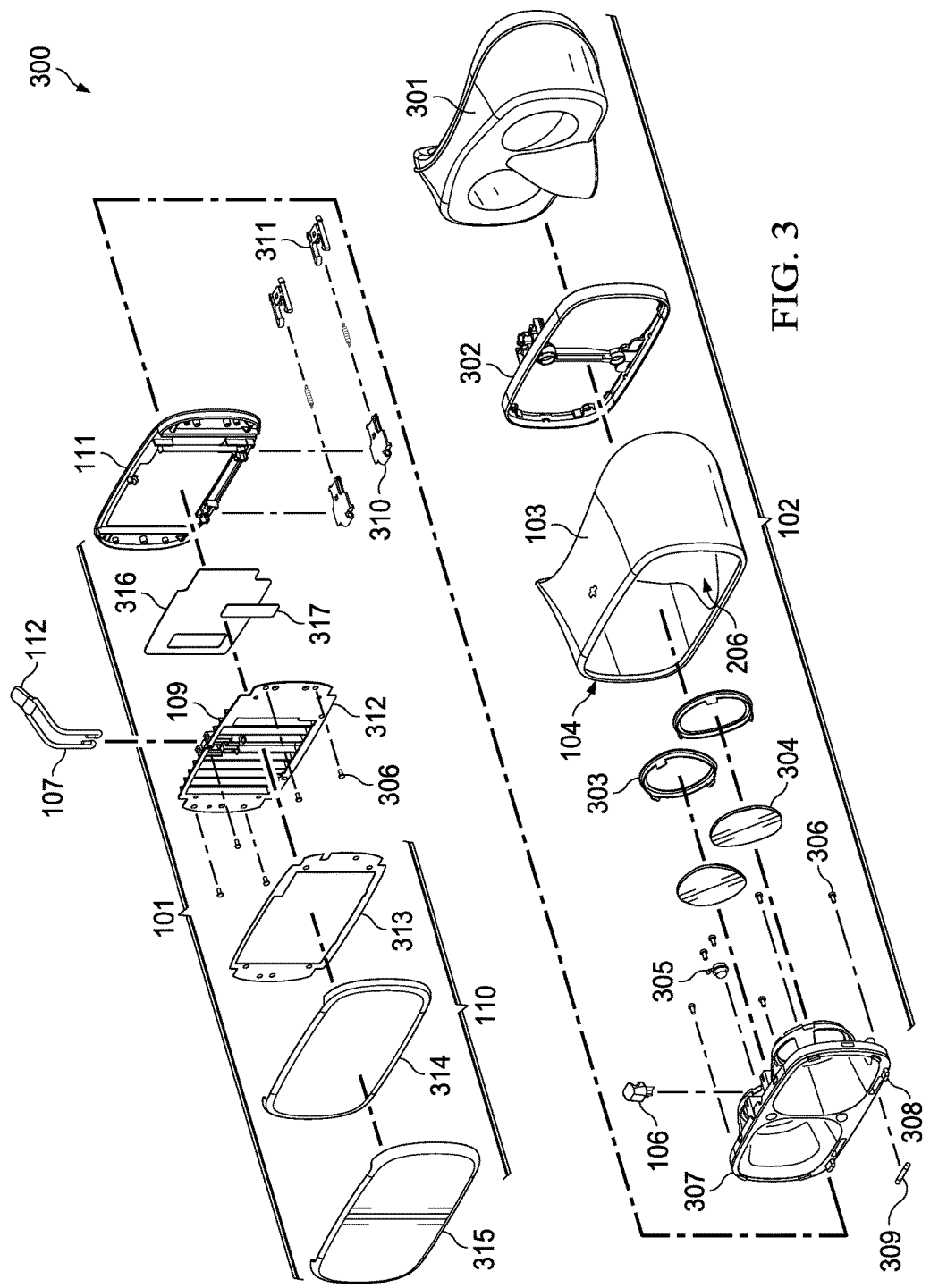
FIG. 3 is a diagram illustrating an exploded perspective view of the HMD device of FIG. 1 in accordance with some embodiments.

FIG. 3 is a diagram illustrating an exploded perspective view 300 of components of the HMD device 100 of FIG. 1 in accordance with some embodiments. The view 300 includes an inner shell 301 that forms an interior surface closest to the face of a user. The inner shell 301 includes a surface that is contoured around a bridge of a nose of the user and provides openings for a user's eyes to peer into the interior of the HMD device 100. A frame 302 provides a stiff structural mounting between the inner shell 301 and the outer surface 103 in the compartment 206. The frame 302 provides a mounting point through a hole in the outer surface 103 for the peg 106. A contour of the outer surface 103 matches the contour of the inner shell 301 around the bridge of the nose. Each of a pair of circular lens frames 303 includes tabs for holding a pair of lenses 304 for left and right eyes of a user. A connector 305 couples the frame 302 to a lens housing 307. When assembled, the lens housing 307 presses firmly against the front surface 104 of the outer surface 103.

Screws 306 pass through the lens housing 307 and mount hinge brackets 308 securely to the lens housing 307. Hinge pins 309 are mounted between ends of the hinge brackets 308 thereby coupling the thermal door component 101 to the head mount body 102. The hinge brackets 308 may be the distal ends of respective housing-side hinge pieces 311. A pair of thermal door component hinge pieces 310 mate with corresponding housing-side hinge pieces 311 thereby mounting the thermal door component 101 to the lens housing 307 of the HMD device 100. The body of the hinge pieces 310 are mounted inside the body of the thermal door component 101 and may be secured and held in place by one or more screws 306.

In FIG. 3, the thermal door component 101 includes various components or portions according to some embodiments. For example, the thermal door component 101 includes a substantially planar first portion 111. The first portion 111 is preferably made of a thermally conductive material or composite of one or more thermally conductive materials. The first portion 111 rests against a back surface of a mobile device (not shown in FIG. 3). The outer silhouette of the first portion 111 matches the outer silhouette of the outer surface 103. A heat sink 312 is positioned between the first portion 111 and a back shell 315 at a most exterior of the thermal door component 101. The components of the thermal door component 101 are disposed between the first portion 111 and the back shell 315.

Optionally, a thermally conductive material 316 is tightly placed between the heat sink 312 and the first portion 111. According to some embodiments, the thermally conductive material 316 is planar and shaped to fit within ribs and surface features of the first portion 111. By way of example, a planar portion of the thermally conductive material 316 or the heat sink 312 is coupled to at least 10%, 20%, 30%, 40%, 50%, 60%, 70%, or 80% of a back surface of the first portion 111. The thermally conductive material 316 facilitates a strong thermal connectivity between the heat sink 312 and provides structural support to the heat sink 312 relative to the other components. The heat sink 312 may include one or more fins 109. The fins 109 provide open vertical channels between successive fins 109. The fins 109 provide additional surface area to ambient air to increase thermal energy exchange between the thermal door component 101 and the ambient air. The open vertical channels are continuous with the top opening of the thermal door component 101. The heat sink 312 may be made of a thermally conductive material, or combination of two or more such materials, such as magnesium, copper, zinc, aluminum, tin, a carbon composite, a graphite, a synthetic graphite material, a graphene, and the like, or a combination of thermally conductive and thermally insulative materials. A supporting frame 313 and a back piece 314 may be placed between the heat sink 312 and the back shell 315. The frame 313 may provide a stiffening effect to the thermal door component 101. The back piece 314 may provide one or more benefits such as reflecting heat into the interior of the thermal door component 101 so as to increase a temperature of the air inside the channels between the fins 109 and thereby further improve thermal convective circulation of air within and outside of the thermal door component 101. The back piece 314 may reduce a temperature of the outer back shell 315 relative to the temperature of the heat sink 312 and the first portion 111.

A near field communication (NFC) tag 317 may be incorporated into the thermal door component 101 such as in a coplanar orientation with respect to the first portion 111. The NFC tag 317 may include an NFC antenna. A mobile device may be programmed to detect when the thermal door component 101 is properly closed against the back of the mobile device by sensing a presence of the NFC tag 317 thereby triggering a communication that the thermal door component 101 is in its proper place during operation of the mobile device. Alternatively, the mobile device may be programmed to trigger a warning display or warning sound in the absence of detection of a proper orientation of the NFC tag 317 with respect to the mobile device when in operation proximate to the thermal door component 101. When properly secured within the device 100 with the thermal door component 101 properly situated, a mobile device operates four, five, six, or more degrees Fahrenheit (deg. F) (two, three, or more degrees Celsius (deg. C)) cooler than not situated against the thermal door component 101. Thus, the presence of an NFC tag in the thermal door component 101 can provide a useful signal to an electronic device when placed in an HMD device.

Figure 4:
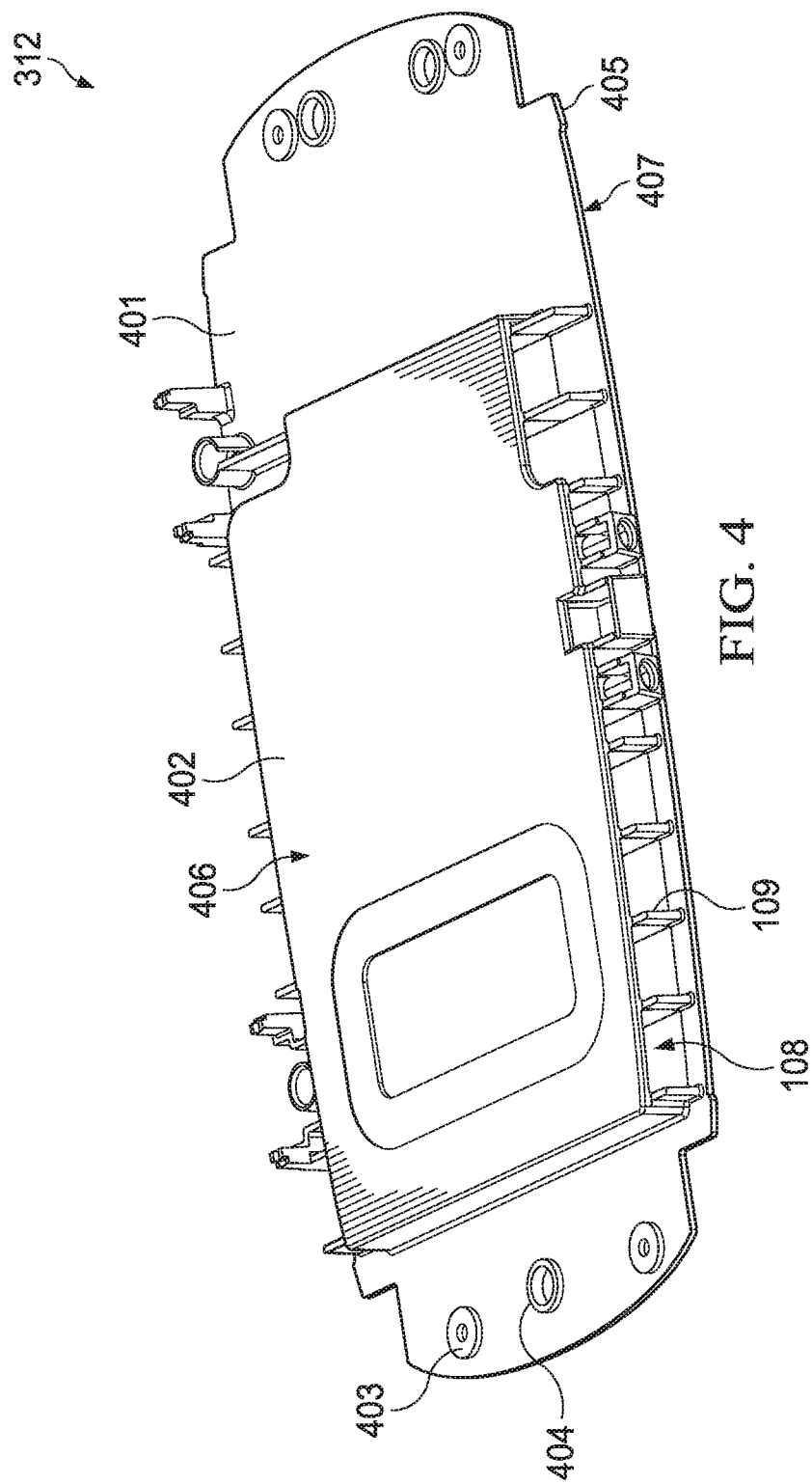
FIG. 4 is a diagram illustrating a thermal conducting element of a thermal door component in accordance with some embodiments.

FIG. 4 is a diagram illustrating a thermal conducting element or heat sink 312 of a thermal door component in accordance with some embodiments. In FIG. 4, the heat sink 312 includes a first substantially planar portion 401 and a second substantially planar portion 402. Between the planar portions 401, 402 are formed one or more openings 108 into the interior region under the second planar portion 402. Fins 109 provide increased surface area for heat transfer between ambient air and the surfaces of the heat sink 312. The fins 109 provide structural support to the second planar portion 402. Multiple air channels are formed between successive fins 109. The first planar portion 401 is formed with one or more fastener openings 403 and one or more pin openings 404. The fastener openings 403 may be aligned with a respective pin formed on one of the other components of the thermal door component 101 such as the first portion 111, the supporting frame 313, the back piece 314, or the back shell 315. The pin openings 404 accommodate screws 306 or other fasteners to keep the various components of the thermal door component 101 in place when assembled. A first surface 406 of the second planar portion 402 is pressed, mated, or coupled to a portion of the first portion 111 or to a portion of the thermally conductive material 316.

The heat sink 312 includes one or more tabs 405 along an outer edge 407. The tabs 405 may be aligned with and mated into respective recesses in the other components of the thermal door component 101 when assembled.

Figure 5:
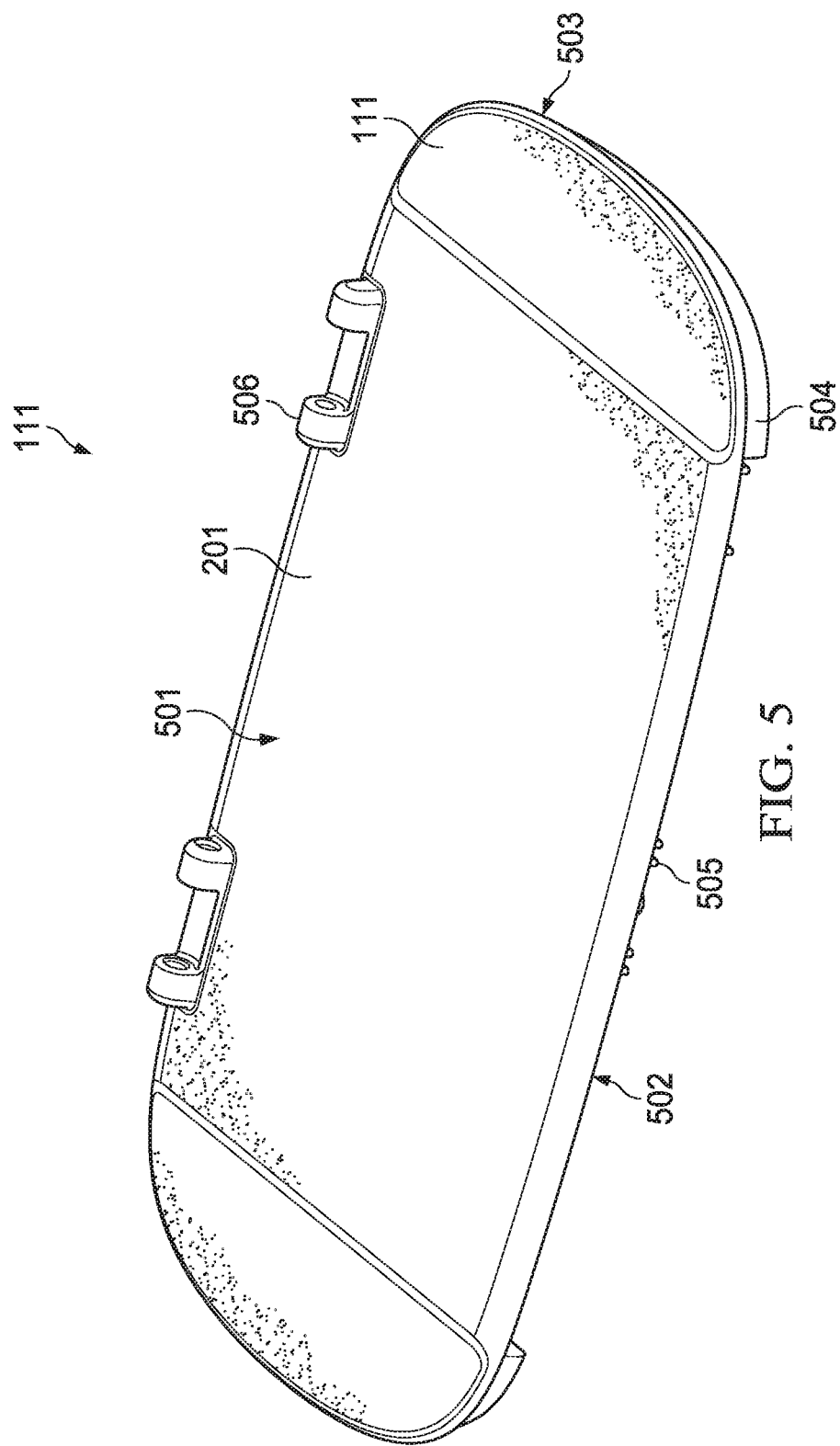
FIG. 5 is a diagram illustrating a portion of a thermal door component in accordance with some embodiments.

FIG. 5 is a diagram illustrating a first portion 111 of a thermal door component 101 in accordance with some embodiments. The first portion 111 includes a first surface 501 in a recessed region 201. The first surface 501 mates or couples to a back of a mobile device that is the source of heat for transfer to the thermal door component 101. The first portion also includes a second surface 502, an outer edge 503, and curved support features 504 and linear support features 505 that generally extend perpendicularly from the first surface 501. In some embodiments, the outer edge 503 is shaped to generally have the same silhouette as the outer silhouette of the head mount body 102 illustrated in FIGS. 1 and 2. Distal ends 506 of thermal door component hinge pieces 310 extend through the first portion 111 and above the first surface 501. The distal ends 506 receive a hinge pin facilitate coupling of a thermal door component to the remainder of an HMD device.

Figure 6:
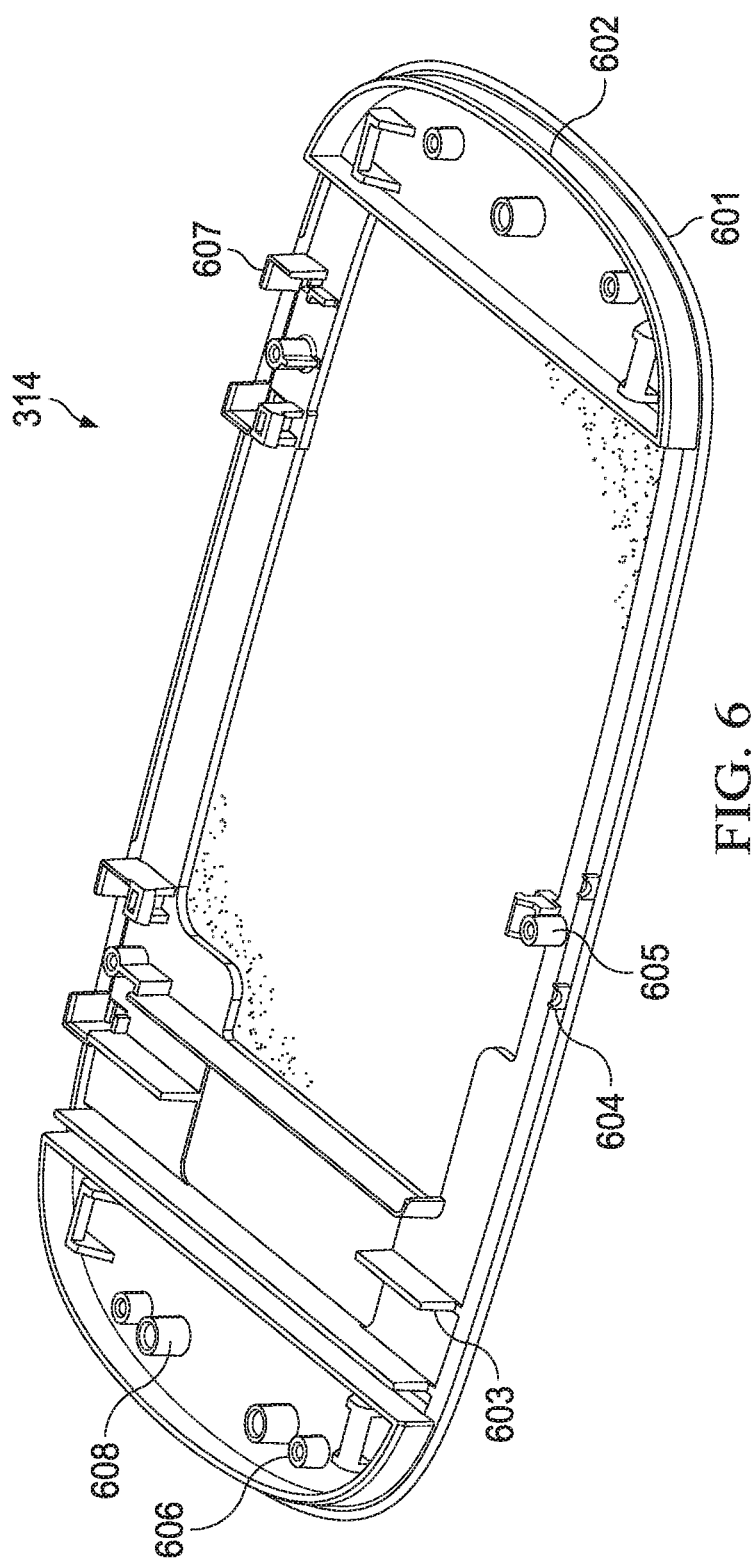
FIG. 6 is a diagram illustrating a back piece of a thermal door component as shown in FIG. 3 in accordance with some embodiments.

FIG. 6 is a diagram illustrating a back piece 314 of a thermal door component as shown in FIG. 3 in accordance with some embodiments. In FIG. 6, the back piece 314 includes a planar portion 601 that substantially extends over a length and width of the back piece 314. The back piece 314 includes one or more curved support features 602 and one or more linear support features 603. The support features 602, 603 generally extend perpendicular up from the planar portion 601 and provide increased resistance against bending forces and increased rigidity to the back piece 314. The back piece 314 also includes one or more threaded barrel features 605 for receiving a screw inside the recess 606 of the same when the thermal door component is assembled. The back piece 314 also includes one or more pegs or pins 608 that match or mate with corresponding pin openings 404 of a heat sink such as heat sink 312 illustrated in other figures. In FIG. 6, the back piece 314 includes one or more raised hinge features 607 for coupling to or supporting a respective thermal door component hinge piece such as hinge piece 310 in FIG. 3. When assembled together, the back piece 314 of FIG. 6 and the first portion 111 of FIG. 5 form an opening into an interior of a thermal door component such as the thermal door component 101 first illustrated in FIG. 1. That is, one or more of the first portion 111 and the back piece 314 are contoured along their edge or edges to form an opening to allow ambient air to circulate in and outside of the thermal door component to facilitate heat removal from a mobile device coupled inside of an HMD device.

Note that not all of the elements described above in the general description are required, that a portion of a specific example device may not be required, and that one or more further elements may be included in addition to those described. Still further, the order in which the features or components appear in the examples and figures described herein are just some of many ways that the features and components may be combined to create a device as described generally herein. The concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A head mounted display device comprising: a frame having a leading edge for placing adjacent a face of a user, the frame enclosing a viewing compartment; and a thermal door component coupled to a back surface of a mobile electronic device positioned at a distal end of the viewing compartment, the thermal door component including:
a first substantially planar portion for reversibly mating to the back surface of the mobile electronic device; a second portion at least partially forming an opening at an edge of the thermal door component, the first substantially planar portion and the second portion forming an open thermal convection channel within an interior of the thermal door component and contiguous with the opening at the edge of the thermal door component; and a thermally conductive material and a heat sink, a surface of the thermally conductive material and a surface of the heat sink being mated to a back surface of the first substantially planar portion of the thermal door component.

2. The head mounted display device of claim 1, the thermal door component further including a thermally conductive heat sink that includes a substantially planar portion coupled to the first substantially planar portion of the thermal door component.

3. The head mounted display device of claim 1, wherein the heat sink includes fins that extend substantially linearly, and wherein the fins are arranged from a top edge to a bottom edge of the thermal door component within the interior of the thermal door component.

4. The head mounted display device of claim 1, wherein the second portion of the thermal door component includes a fin that extends from the first substantially planar portion to the second portion, and wherein the fin is arranged perpendicularly to a plane of the first substantially planar portion within the thermal door component.

5. The head mounted display device of claim 1, wherein the first substantially planar portion includes a first material that is thermally conductive, and wherein the second portion of the thermal door component includes a second material different from the first material.

6. The head mounted display device of claim 5, wherein an outer edge of the first substantially planar portion and an outer edge of the second portion are of a same silhouette and aligned with each other, and wherein the heat sink fits within the silhouette of the first material and the second material.

7. The head mounted display device of claim 5, wherein the first material includes one of a polyamide, a polybutylene terephthalate (PBT), a polycarbonate, a polyphenylene Sulfide (PPS), and a polyetherimide.

8. The head mounted display device of claim 1, wherein the thermal door component further includes a hinge coupled to the edge of the thermal door component and coupled to a corresponding location of the frame.

9. The head mounted display device of claim 8, further comprising an elastic fastener attached at a first side of the elastic fastener to the thermal door component and to a portion of a feature of the frame at a second side of the elastic fastener for coupling the thermal door component to the frame.

10. The head mounted display device of claim 1, wherein the thermally conductive material is substantially enclosed within an interior of the thermal door component.

11. The head mounted display device of claim 10, wherein the thermally conductive material includes at least one of: magnesium, copper, zinc, tin, aluminum, graphite, and graphene.

12. The head mounted display device of claim 1, wherein the first substantially planar portion and the second portion form an opening along a top edge of the thermal door component and an opening along a bottom edge of the thermal door component, and wherein the thermal convection channel extends through the thermal door component between the opening along the top edge and the opening along the bottom edge.

13. The head mounted display device of claim 1, wherein the thermally conductive material includes at least one of: magnesium, copper, zinc, tin, aluminum, graphite, and graphene.

14. The head mounted display device of claim 1, wherein the thermal door component further includes a near field communication (NFC) tag oriented substantially coplanar with the first substantially planar portion.

15. The head mounted display device of claim 1, wherein the first substantially planar portion of the thermal door component or the second portion includes a thermoplastic and a silicone based material bonded together in a two-shot process.

16. The head mounted display device of claim 1, further comprising a strap coupled to the thermal door component at a first end of the strap and to an outer surface of the frame at a second end of the strap, the strap bearing a first portion of a hook and loop fastener, the outer surface of the frame bearing a second portion of the hook and loop fastener.

17. The head mounted display device of claim 1, wherein the first substantially planar portion and the second portion form another opening along a bottom edge of the thermal door component, the open thermal convection channel being contiguous with the other opening along the bottom edge of the thermal door component.

18. A head mounted display device comprising:
- a frame having a leading edge for placing adjacent a face of a user, the frame enclosing a viewing compartment; and
- a thermal door component coupled to a back surface of a mobile electronic device positioned at a distal end of the viewing compartment, the thermal door component including:
  - a first substantially planar portion for reversibly mating to the back surface of the mobile electronic device;
  - a second portion at least partially forming an opening at an edge of the thermal door component, the first substantially planar portion and the second portion forming an open thermal convection channel within an interior of the thermal door component and contiguous with the opening at the edge of the thermal door component; and
  - a thermally conductive material and a heat sink, each having a planar portion, a surface of the thermally conductive material being coupled to at least 30% of a back surface of the first substantially planar portion of the thermal door component.

19. A head mounted display device comprising:
- a frame having a leading edge for placing adjacent a face of a user, the frame enclosing a viewing compartment; and
- a thermal door component coupled to a back surface of a mobile electronic device positioned at a distal end of the viewing compartment, the thermal door component including:
  - a first substantially planar portion for reversibly mating to the back surface of the mobile electronic device;
  - a second portion at least partially forming an opening at an edge of the thermal door component, the first substantially planar portion and the second portion forming an open thermal convection channel within an interior of the thermal door component and contiguous with the opening at the edge of the thermal door component and
  - a thermally conductive material and a heat sink, each having a planar portion, a surface of the heat sink being coupled to at least 30% of a back surface of the first substantially planar portion of the thermal door component.

\* \* \* \* \*